United States Patent [19]

Liu et al.

[11] Patent Number: 4,762,747
[45] Date of Patent: Aug. 9, 1988

[54] SINGLE COMPONENT AQUEOUS ACRYLIC ADHESIVE COMPOSITIONS FOR FLEXIBLE PRINTED CIRCUITS AND LAMINATES MADE THEREFROM

[75] Inventors: Jonq-Min Liu, Hsinchu; Fu-Lung Chen, Taipei; Yeong-Cherng Chiou, Hsi-Chih, all of Taiwan

[73] Assignee: Industrial Technology Research Institute, Hsin Chu, Taiwan

[21] Appl. No.: 891,655

[22] Filed: Jul. 29, 1986

[51] Int. Cl.$^4$ .................... C09J 7/02; B32B 15/08
[52] U.S. Cl. .................... 428/343; 428/354; 428/355; 428/458; 428/473.5; 428/901; 524/548
[58] Field of Search .............. 428/355, 473.5, 343, 428/354, 458, 901; 525/185; 524/548

[56] References Cited

U.S. PATENT DOCUMENTS

| | | | |
|---|---|---|---|
| 3,728,150 | 4/1973 | Yuan | 428/355 |
| 3,763,117 | 10/1973 | McKenna et al. | 428/355 X |
| 3,900,662 | 8/1975 | Yuan | 428/355 X |
| 3,900,674 | 8/1975 | Coffman | 428/355 |
| 4,044,070 | 8/1977 | Labana et al. | 525/185 X |

*Primary Examiner*—Thomas J. Herbert
*Attorney, Agent, or Firm*—Ladas & Parry

[57] ABSTRACT

Described is a single component aqueous adhesive composition especially suitable for flexible printed circuits. The composition consists of water and a homogeneous film-forming acrylic polymer. The acrylic polymer is a polymerization product of (A) acrylonitrile or methacrylonitrile, or mixture thereof, (B) an alkyl acrylate or methacrylate having 1–12 carbon atoms in the alkyl group, or mixture thereof, (C) an oxirane-containing polymerizing ethylenic monomer and (D) a hydroxyl- or amide-containing acrylate or methacrylate.

The adhesive composition is useful for bonding metal foils to polyimide films in the manufacture of flexible printed circuits.

11 Claims, No Drawings

SINGLE COMPONENT AQUEOUS ACRYLIC ADHESIVE COMPOSITIONS FOR FLEXIBLE PRINTED CIRCUITS AND LAMINATES MADE THEREFROM

The present invention relates to adhesive compositions for flexible printed circuits (FPC), and more particularly to water-based adhesive compositions comprising a homogeneous acrylic polymer made from (A) acrylonitrile or methacrylonitrile, or mixture thereof, (B) an alkyl acrylate or methacrylate having 1-12 carbon atoms in the alkyl group, or mixture thereof, (C) an oxirane-containing polymerizing ethylenic monomer, and (D) a hydroxyl-, and/or amide-containing acrylate or methacrylate. The invention also relates to adhesive-coated polyimide films, and laminates made from the films and metal foils.

BACKGROUND OF THE INVENTION

In recent years, with the advancement of electronic technology, reduction in size and in weight, and high reliance of instruments (e.g. those for communication and defense industries), appliances and the like, and simplification of packaging systems have been required. A printed circuit board having light and flexible plastic film as insulating base board has long been desired.

The plastic films suitable for use in FPC include polyester films and polyimide films. The polyimide films exhibit excellent solderability and other physical properties and have become the main stream of FPC substrates.

It is well-known in the art that many adhesives do not bond well to polyimide films. Conventional adhesives having commercially acceptable adhesion to bond the polyimide films to metal foils (such as copper, aluminum, and the like) are acrylonitrile-butadiene copolymer, butyral resin, epoxy resin, nylon/epoxy resin, acrylonitrile-butadiene/phenolic resin, acrylics/epoxy resin, etc. However, the use of flammable organic solvents such as toluene, methylethyl ketone, acetone, etc. is required in these adhesive compositions. This could cause several disadvantages. For example, evaporation of organic solvents during the coating process needs special precautions to avoid fire hazard and air pollution; or the solvent recovery system adds extra cost.

Water-based adhesives will solve the aforementioned problems. However, to find an aqueous-type adhesive having balanced properties of adhesiveness, thermal stability, flexibility, solderability, dimensional stability, solvent resistance, flow property and electrical property remains to be a challenge. A latex of an acrylic terpolymer disclosed in U.S. Pat. No. 3,900,662 represents an example. However, a crosslinking agent must be added in the latex. Moreover, the polyimide film on which the latex is to be coated requires surface pretreatment such as one with an alkaline solution as taught in U.S. Pat. No. 3,728,150. This adds extra cost and increases the possibility of contamination.

Japanese Patent Laid-Open No. 60,118,781 discloses that a water soluble epoxy compound and an emulsified epoxy resin are mixed with an acrylic latex to form an adhesive composition useful in FPC. However, the mixing procedure is time-consuming and will result in difficulties in quality control.

SUMMARY OF THE INVENTION

This invention provides a single-component water-based acrylic adhesive composition which possesses excellent adhesiveness to bond metal foils to polyimide films without pretreating polyimide films. This invention also provides a polyimide film coated with the said acrylic adhesive composition and laminates made therefrom.

DETAILED DESCRIPTION OF THE INVENTION

The aqueous acrylic adhesive composition of this invention consists of water and a film-forming acrylic polymer. The acrylic polymer is a polymerization product of (A) acrylonitrile or methacrylonitrile, or mixture thereof, (B) an alkyl acrylate or methacrylate having 1-12 carbon atoms in the alkyl group, or mixture thereof (C) an oxirane-containing polymerizing ethylenic monomer and (D) a hydroxyl- or amide-containing acrylate or methacrylate, which has good film-forming properties and good balance between the flow property and the crosslinking temperature. The composition also provides FPC laminates with excellent properties such as excellent electrical property, thermal stability, solvent resistance, and solderability, and particularly it imparts high flexibility and adhesiveness between a metal foil and a polyimide film. A film coated with the composition of this invention can be used directly without any pretreatment. The composition of this invention can be prepared by emulsion polymerization. Therefore pollution control and solvent recovery are no longer required.

The composition of this invention has a solid content of about 10-60% by weight. The remainder of the composition is water and optionally small amounts of diluents and solvents which can be introduced during polymerization of the acrylic polymer or introduced together with other constituents.

The film-forming acrylic polymer suitable for use in the invention is a tetrapolymer which is made from (A) 15-60% by weight of the tetrapolymer of acrylonitrile or methacrylonitrile, or mixture thereof (B) 30-85% by weight of the tetrapolymer of an alkyl acrylate or methacrylate having 1-12 carbon atoms in the alkyl group, or mixture thereof (C) 1-30% by weight of the tetrapolymer of an oxirane-containing polymerizing ethylenic monomers, and (D) up to 15% by weight of the tetrapolymer of a hydroxyl and/or amide-containing acrylate or methacrylate. Although the acrylic polymer preferably comprises component (D), the acrylic polymer containing only components (A), (B) and (C) is suitable for use in FPC. Such polymer is also contemplated as within the scope of the present invention.

The alkyl acrylates and methacrylates suitable for use in the invention have 1-12, preferably 2-8, carbon atoms in the alkyl groups. For example, they may be ethyl acrylate and methacrylate, propyl acrylate and methacrylate, isopropyl acrylate and methacrylate, butyl acrylate and methacrylate, isobutyl acrylate and methacrylate, pentyl acrylate and methacrylate, hexyl acrylate and methacrylate, 2-ethylhexyl acrylate and methacrylate, nonyl acrylate and methacrylate, lauryl acrylate and methacrylate and the like. Ethyl acrylate, butyl acrylate and 2-ethylhexyl acrylate are most preferred. For certain uses, it may be desirable to add styrene.

Examples of oxirane-containing polymerizing ethylenic monomers are glycidyl acrylate, glycidyl methacrylate, allyl glycidyl ether and the like. Glycidyl acrylate and methacrylate are preferred.

The hydroxyl and/or amide-containing acrylate or methacrylate useful in the present composition is selected from the group consisting of 2-hydroxylethyl acrylate, 2-hydroxylpropyl acrylate, acrylamide, 2-hydroxylethyl methacrylate, 2-hydroxylpropyl methacrylate, N-methylolacrylamide, and methacrylamide. 2-Hydroxylethyl acrylate, acrylamide, N-methylolacrylamide and 2-hydroxylethyl methacrylate are preferred.

Preferably, the acrylic polymer is of about 30–40% by weight of acrylonitrile or methacrylonitrile, 50–65% by weight of an alkyl acrylate having 2–8 carbon atoms in the alkyl group, 2–15% by weight of glycidyl methacrylate, and 0.5–10% by weight of 2-hydroxylethyl acrylate or acrylamide.

The acrylic polymer can be prepared by solvent or emulsion polymerization. Emulsion polymerization is preferable because of low cost and non-use of organic solvents.

The emulsion polymerization may be conducted in batch. However, semicontinuous emulsion polymerization is preferred. The monomer conversion is normally higher than 98% and the final nonvolatile content is usually 45–55% by weight of the composition. Particle size is determined by the level of primary surfactant in the initial reactor charge. Polymer Tg should be between 15° C. and 45° C.

In preparing the acrylic polymer, components (A), (B), (C), and (D) are copolymerized in water through free radical induced polymerization, using a peroxy or azo compound as initiator, e.g. a persulfate, benzoyl peroxide, t-butylhydroperoxide, cumene hydroperoxide, azobis-isobutyronitrile, dimethyl azobis-isobutyrate, etc. If necessary, the initiator may contain alkali metal sulfate or ammonium persulfate with or without a modified reducing substance (e.g. sodium bisulfite or ferrous sulfate). A preferred initiator is ammonium persulfate or potassium persulfate. The initiator normally is used at a level of about 0.1% to 3.0% by weight of the monomers. Polymerization generally is conducted at about 50°–80° C. for about 1–4 hours to form an emulsion or a dispersion in which the resulting polymer has a weight average molecular weight of at least 250,000, preferably from 400,000 to 800,000.

The pH of the polymer thus obtained is about 3–7. A suitable amount of amine may be added to adjust the pH up to about 7–10. Typical amines that can be used are triethylamine, diethanol amine, ethanolamine, N-methyl ethanolamine, methyl diethanolamine, diethylene tetramine and the like. Other minor additives such as defoamers or thickeners can be incorporated into the composition as needed.

The adhesive composition of the present invention can be applied to the polyimide film by conventional procedures such as spraying, dipping, brushing, roll coating, and the like. This adhesive composition can be applied in varying thickness, depending on the particular end use of coated films. Greater adhesive thickness can be achieved by a plurality of coatings. Typically, the acrylic adhesive has the thickness of at least 0.1 mils, preferably about 0.5–3 mils. At present, there is no need for the adhesive coated on the polyimide film to be thicker than about 10 mils.

Polyimides suitable for use as films in this invention are disclosed in U.S. Patent No. 3,900,662, the disclosure of which is hereby incorporated by reference. The usual polyimide films are, for example, Kapton ® (available in E. I. Du Pont Nemours Co., Delaware, U.S.A.) and Upilex ® (Ube Ind., Ltd., Japan) films. The polyimide films coated with the adhesive composition of this invention can be used to form various types of laminate articles and can be used in combination with various external layers of metal foils such as copper, aluminum, nickel, and the like to yield useful printed circuit boards. Standard lamination procedures can be used to construct these laminates such as vacuum bag lamination, press lamination, roll lamination and the like.

The article obtained by bonding a polyimide film to a metal foil with the adhesive composition of this invention is insoluble in organic solvents, such as methylethyl ketone, trichloroethylene, methylene chloride, acetone, methanol, toluene and the like, which property is essential in the production of printed circuits. The laminate is resistant to chemicals such as a 10% aqueous caustic soda solution, a 10% aqueous ammonium persulfate solution and the like, and is excellent in soldering heat resistance, flexibility, electrical insulation, and adhesiveness, and therefore it is an excellent base board for flexible printed circuits without impairing the characteristics of the base film.

The adhesive composition of this invention is useful as an adhesive or as a film adhesive in the backing of a flexible printed circuit with a hard board for the purpose of reinforcement of its parts-loading position, in the intergral lamination of a flexible printed circuit with a hard printed circuit for the purpose of forming high density wiring of circuits and simplification of connection, and in the multilamination of a flexible printed circuit with one another. The adhesive property, flow property, and heat resistance of the adhesive composition satisfy the quality required for common flexible printed circuits.

This invention is illustrated by but is not limited to the following specific examples in which the parts and percentages are expressed on the weight basis.

EXAMPLE 1

[Preparation of acrylic emulsion copolymer containing acrylonitrile (AN)/ 2-ethylhexylacrylate (EHA)/ glycidyl methacrylate(GMA)/ 2-hydroxylethyl methacrylate (HEMA)]

250 parts of deionized water, 2.0 parts SDS(sodium dodecyl sulfate), and 0.1 parts sodium bisulfite were loaded into a reactor and heated under nitrogen with agitation to 60° C. A mixture of 14 parts acrylonitrile, 30 parts 2-ethylhexyl acrylate, 1.5 parts glycidyl methacrylate, and 1.5 parts 2-hydroxylethyl methacrylate was then added to the reactor and emulsified for 10 minutes, whereupon 0.25 parts of potassium persulfate were added. The reaction mixture is allowed to react for another 20 minutes, before the subsequent monomer feeding started.

The subsequent monomer mixture contained 70 parts of AN, 150 parts of EHA, 7.5 parts of GMA, and 7.5 parts of HEMA. This mixture was added at a constant rate to the reactor so that the addition was completed within 3.0 hours. The batch was then hold for one hour at the reaction temperature before cooling and filtration. The amount of coagulant is less than 0.01 parts.

The adhesive thus obtained was coated on an unpretreated polyimide film (Upilex 25S, a registered trademark of Ube Co.) of 25μ in thickness, by means of a two-roller coater in which a coating roll section, a drying zone, and a cover-lay laminator were connected in series. The resulting coated film was about 53μ thick. The coated film was then adhered to a copper foil having the thickness of 35μ by pressing them in a hot press at 180° C. under a pressure of 300 psi for 10 minutes. The resulting flexible copper-clad laminate was excellent in bond strength, chemical resistance, and electrical properties, and outstanding in heat resistance, and could withstand 30-second immersion in a solder bath at 260° C. The results were shown in Table 1.

EXAMPLE 2

In a manner similar to Example 1, an adhesive was prepared by using the following components:

| Components | Parts |
| --- | --- |
| methacrylonitrile | 20 |
| butylacrylate | 70 |
| glycidyl methacrylate | 5 |
| N—methylolacrylamide | 5 |
| Emulsifier (Abex* 18S, 35% aqueous solution) | 6 |
| D.I. Water | 120 |

(*A trade name of Alcolac Inc., USA)

The resulting adhesive was coated on an unpretreated polyimide film (Kapton ®, a registered trademark of Du Pont Company) of 50μ in thickness, until the coated film has the thickness of about 80μ. After drying at 120° C. for 5 minutes, the coated film was adhered to a copper foil, 35μ in thickness, by pressing them in a hot press to prepare a flexible copper-clad laminate, which properties were shown in Table 1.

EXAMPLE 3

In a manner similar to Example 1, a latex was prepared by using the following components:

| Components | Parts |
| --- | --- |
| Acrylonitrile | 40 |
| Ethylhexylacrylate | 70 |
| Styrene | 5 |
| Glycidyl methacrylate | 8 |
| Acrylamide | 10 |
| Emulsifier SDS | 1.5 |
| D.I. Water | 200 |

To 200 parts of the resulting latex was added 0.1 parts sodium polyacrylate to adjust the viscosity to 220 cps. The varnish thus obtained was coated on a polyimide film (Upilex-25S), 25μ in thickness, until the coated film is about 55μ thick. After drying at 150° C. for 5 minutes, the coated film was adhered to a copper foil, 35μ in thickness, in a hot press at 180° C. under a pressure of 300 psi for 10 minutes to form a copper-clad laminate. The properties of the resulting laminate were shown in Table 1.

EXAMPLE 4

In the same manner as in Example 1, the adhesive varnish having a concentration of 45% was prepared by reacting the following components:

| Components | Parts |
| --- | --- |
| Acrylonitrile | 50 |
| 2-Ethylhexylacrylate | 180 |
| Glycidyl methacrylate | 15 |
| 2-hydroxylethyl methacrylate | 15 |
| Emulsifier (Abex 18S) | 12 |
| D.I. Water | 300 |

In the same manner as in Example 1, the adhesive varnish thus obtained was coated on a polyimide film, 125μ in thickness, and the coated film of 153μ in thickness was bonded to a copper foil of 35μ in thickness, by application of heat and pressure by means of a hot press to obtain a flexible copper-clay laminate, the properties of which were shown in Table 1.

EXAMPLE 5

Repeating the procedure of Example 1 and using the following components, an adhesive varnish was prepared:

| Components | Parts |
| --- | --- |
| Acrylonitrile | 40 |
| Ethylacrylate | 140 |
| Glycidyl methacrylate | 10 |
| Methacrylamide | 10 |
| D.I. Water | 200 |
| SDS | 6 |

In the same manner as in Example 1, the adhesive varnish thus obtained was coated on a polyimide film, 50μ in thickness, and the coated film of 78μ in thickness was bonded to a copper foil of 70μ in thickness, by application of heat and pressure by means of a hot press to obtain a flexible copper-clad laminate, the properties of which were shown in Table 1.

COMPARATIVE EXAMPLE 1

| Components | Parts |
| --- | --- |
| Acrylonitrile | 35 |
| Butylacrylate | 60 |
| Glycidyl methacrylate | 5 |
| Methacrylic acid | 5 |
| Emulsifier (SDS) | 1.5 |
| D.I. Water | 120 |

In the same manner as in Example 1, the adhesive varnish obtained from the above recip was coated on a polyimide film, 50μ in thickness, and the coated film of 78μ in thickness was bonded to a copper foil, 35μ in thickness, by application of heat and pressure (180° C., 350 psi) by means of a hot press for 40 minutes to obtain a flexible copper-clad laminate. The peel strength was poor as shown in Table 1.

EXAMPLE 6

| Components | Parts |
| --- | --- |
| Acrylonitrile | 35 |
| Butylacrylate | 60 |
| Glycidyl methacrylate | 5 |
| Emulsifier (SDS) | 1.5 |
| D.I. Water | 120 |

The resulting latex made from the above recipe had about 8% of coagulant. The filtrated adhesive varnish was coated on a polyimide film. The copper-clad laminate was made according to the same manner as in example 1. The properties of the laminate were shown in Table 1.

EXAMPLE 7

By use of the laminate of the present invention, a flexible printed circuit with a circuit land area was prepared by the etching method.

The adhesive of this invention was coated on a polyimide film of 25μ in thickness, and dried at 120° C. for 5 minutes, and thereafter the areas corresponding to the land were punched off from the film. The film thus obtained was placed over a printed circuit in a registered position, and the resulting composite was heated and pressed for 60 minutes by means of a hot press operating at 180° C. and under 350 psi. The resulting printed circuit board had the copper foil circuit portion completely embedded in a cover-lay coated with the adhesive, and the adhesive would not exude to the exposed portion of the circuit land, indicating satisfactory covering. The printed circuit would neither fail at the boundry of the cover-lay when subjected to the attack of chemicals as a flex during soldering, nor suffer from rupture of adhesive bonding when subjected to flow soldering at the temperature of 260° C. This indicates that the circuit has excellent heat resistance.

We claim:

1. An aqueous acrylic adhesive composition useful for flexible printed circuits consisting essentially of water and an acrylic polymer, the acrylic polymer comprising
   (a) 15-60% by weight of acrylonitrile, methacrylonitrille or mixture thereof,
   (b) 30-85% by weight of an alkyl acrylate or methacrylate having 1-12 carbon atoms in the alkyl group, or mixture thereof,
   (c) 1-30% by weight of an oxirane-containing polymerizing ethylenic monomer,
   (d) up to 15% by weight of a hydroxyl or amide-containing acrylate or methacrylate and,
   (e) styrene;
      the acrylic polymer being present in an amount of about 10-60% by weight of the composition; the composition comprising a single component adhesive.

2. A polyimide film coated with the acrylic adhesive composition of claims 1.

3. The composition of claim 1 wherein the polymer comprises, based on the weight of the polymer, 30-40% by weight of acrylonitrile or methacrylonitrile, 50-65% by weight of an alkyl acrylate having 2-8 carbon atoms in the alkyl group, 2-15% by weight of the oxirane-containing polymerizing ethylenic monomer, 0.5-10% by weight of the hydroxyl- or amide-containing acrylate or methacrylate and 0.5% by weight of styrene.

4. The composition of claim 1 wherein the alkyl acrylate is ethyl acrylate, butyl acrylate or 2-ethylhexyl acrylate.

5. The composition of claim 4 wherein the alkyl acrylate is butyl acrylate.

6. The composition of claim 1 wherein the oxirane-containing polymerizing ethylenic monomer is glycidyl acrylate or methacrylate.

7. The composition of claim 6 wherein the oxirane-containing polymerizing ethylenic monomer is glycidyl methacrylate.

8. The composition of claim 1 wherein the said hydroxyl- or amide-containing acrylate or methacrylate is selected from the group consisting of 2-hydroxyethyl acrylate, 2-hydroxylpropyl acrylate, acrylamide, 2-hydroxylethyl methacrylate, 2-hydroxylpropyl methacrylate, and methacrylamide.

9. The composition of claim 8 wherein the hydroxyl- or amide-containing acrylate or methacrylate is 2-hydroxylethyl acrylate or acrylamide.

10. A laminate comprising a polyimide film coated with the acrylic adhesive composition of claims 1, and at least one metal foil with the polyimide film adhered thereto.

11. The laminate, as in claim 10, which is capable of withstanding a 30 sec immersion in a solder bath at 260°.

TABLE 1

| Item of Test | Testing Method | Example 1 | Example 2 | Example 3 | Example 4 | Example 5 | Example 6 | Comparative Example 1 |
|---|---|---|---|---|---|---|---|---|
| Peel strength (lbs/in) | IPC-650-2.4.9A | 12 | 11 | 12 | 11 | 13 | 9 | 3 |
| Dielectric Constant | ASTM-D150 (f = 1 MHZ) | 4.0 | 3.5 | 3.7 | 3.6 | 3.4 | 4.0 | 3.7 |
| Dissipation Factor | ASTM-D150 (f = 1 MHZ) | 0.030 | 0.020 | 0.026 | 0.020 | 0.022 | 0.030 | 0.022 |
| Dielectric Strength (KV/mil) | ASTM-D149 | 3.0 | 3.9 | 3.3 | 3.5 | 3.8 | 3.0 | 3.7 |
| Volume Resistivity (Ω-cm) | ASTM-D257 | $4 \times 10^{15}$ | $5 \times 10^{15}$ | $5 \times 10^{15}$ | $6 \times 10^{15}$ | $5 \times 10^{15}$ | $3 \times 10^{15}$ | $4 \times 10^{15}$ |
| Surface Resistivity (Ω) | ASTM-D257 | $4 \times 10^{15}$ | $2 \times 10^{15}$ | $3 \times 10^{15}$ | $4 \times 10^{15}$ | $2 \times 10^{15}$ | $3 \times 10^{15}$ | $2 \times 10^{15}$ |
| Chemical Resistance | IPC-650-2.3.2A | No Change | No Change | No Change | No Change | NO Change | NO Change | Swollen |
| Soldering Resistance | Solder float 30 sec @ 260° C. | No Change | NO Change | No Change | NO Change | No Change | NO Change | Delamination |